United States Patent
You et al.

(10) Patent No.: US 9,698,256 B2
(45) Date of Patent: Jul. 4, 2017

(54) TERMINATION OF SUPER JUNCTION POWER MOSFET

(71) Applicant: Taiwan Semiconductor Manufacturing Co., Ltd., Hsin-Chu (TW)

(72) Inventors: Jheng-Sheng You, Zhubei (TW); Che-Yi Lin, Hsinchu (TW); Shen-Ping Wang, Keelung (TW); Lieh-Chuan Chen, Hsinchu (TW); Po-Tao Chu, New Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/494,793

(22) Filed: Sep. 24, 2014

(65) Prior Publication Data

US 2016/0087034 A1    Mar. 24, 2016

(51) Int. Cl.
*H01L 29/66* (2006.01)
*H01L 29/78* (2006.01)
*H01L 29/06* (2006.01)

(52) U.S. Cl.
CPC ...... *H01L 29/7811* (2013.01); *H01L 29/0634* (2013.01); *H01L 29/0696* (2013.01)

(58) Field of Classification Search
CPC ............. H01L 29/0619; H01L 29/7811; H01L 29/0615; H01L 29/0634; H01L 29/0696; H01L 29/1095; H01L 29/7813; H01L 29/66712; H01L 29/7397; H01L 29/7825; H01L 29/7835; H01L 29/42368; H01L 29/66659; H01L 29/0847; H01L 29/402; H01L 29/784

USPC ............... 257/409, 339, 140, 329, 139, 334, 257/341–342, 378, 565, 335, 328, 506, 257/E29.005, E21.54, E21.418, E29.262; 438/306–307, 268, 510, 421, 270
See application file for complete search history.

(56) References Cited

U.S. PATENT DOCUMENTS

| | | | |
|---|---|---|---|
| 4,965,647 A * | 10/1990 | Takahashi | H01L 29/0619 257/342 |
| 6,844,592 B2 | 1/2005 | Yamaguchi et al. | |
| 2002/0070418 A1 * | 6/2002 | Kinzer | H01L 29/0634 257/496 |
| 2006/0043480 A1 * | 3/2006 | Tsuchitani et al. | 257/341 |
| 2008/0087951 A1 * | 4/2008 | Takaya | H01L 29/0623 257/334 |
| 2008/0087952 A1 * | 4/2008 | Pfirsch | 257/334 |

(Continued)

OTHER PUBLICATIONS

U.S. Appl. No. 14/030,156, filed Sep. 18, 2013.
U.S. Appl. No. 14/141,720, filed Dec. 27, 2013.

*Primary Examiner* — Thao X Le
*Assistant Examiner* — Nduka Ojeh
(74) *Attorney, Agent, or Firm* — Eschweiler & Potashnik, LLC (57) ABSTRACT

The present disclosure relates to an integrated circuit with a termination region, and an associated method of formation. In some embodiments, the integrated circuit comprises a cell region and a termination region. The termination region is disposed at an outer periphery of the cell region. The cell region comprises an array of device cells. The termination region comprises a plurality of termination rings encompassing the cell region. The plurality of termination rings have different depths.

19 Claims, 9 Drawing Sheets

(56) References Cited

U.S. PATENT DOCUMENTS

| | | | |
|---|---|---|---|
| 2010/0032752 A1* | 2/2010 | Hozumi et al. | 257/331 |
| 2011/0049614 A1 | 3/2011 | Gao et al. | |
| 2011/0215418 A1* | 9/2011 | Saito et al. | 257/378 |
| 2013/0075760 A1* | 3/2013 | Takaya | H01L 29/0623 257/77 |
| 2013/0140633 A1 | 6/2013 | Pattanayak | |
| 2015/0214300 A1* | 7/2015 | Barletta | H01L 29/7827 257/330 |

* cited by examiner

TERMINATION OF SUPER JUNCTION POWER MOSFET

BACKGROUND

A power MOSFET is a specific type of metal oxide semiconductor field-effect transistor (MOSFET) designed to handle significant power levels. The power MOSFET is the most widely used low-voltage (that is, less than 200 V) switch. It can be found in most power supplies, DC to DC converters, and low voltage motor controllers.

For higher voltages, such as above 500 V, some manufacturers have begun to use charge compensation or "super junction" techniques. By using such techniques, the resistance in epitaxial layers, which can be the largest resistance contributor in high voltage MOSFETs, can be reduced by a factor of greater than 5 compared to conventional techniques.

BRIEF DESCRIPTION OF THE DRAWINGS

Aspects of the present disclosure are best understood from the following detailed descriptions when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the letter "N" refers to an n-type dopant and the letter "P" refers to a p-type dopant. A plus sign "+" or a minus sign "−" is used to represent, respectively, a relative high or relative low concentration of the dopant. The embodiments and figures are discussed in the context of an n-channel device (the major carriers moved in the channel region is electrons), specifically an n-channel super junction MOSFET. However, embodiments disclosed are not so limited. The discussion of the embodiments and figures can be mapped to a p-type device by substituting n-type dopant and materials for corresponding p-type dopant and materials, and vice versa. Other applicable semiconductor devices comprising the disclosed termination structures are amenable.

Breakdown voltage and on-state resistance have a trade-off relationship for vertical field effect transistors (FETs). The higher the breakdown voltage is, the more the on-state resistance of the vertical FET increases. This is because, in order to obtain a higher breakdown voltage, the thickness of the semiconductor layer is increased or the impurity concentration of the semiconductor layer is decreased, which would increase the on-state resistance. In order to improve the trade-off relationship of the breakdown voltage and the on-state resistance, a super junction structure is applied for some high power applications.

The present disclosure relates to integrated circuits which include a semiconductor device circumscribed by a termination region, and associated methods of formation. In some embodiments, the termination region comprises a plurality of termination rings with different depths and/or different widths. The termination rings can be configured to gradually attenuate electrical potential and/or electrical field to limit risk of device breakdown. Each of the termination rings may comprise deep p-type columns disposed within an n-type epitaxial layer. Deep p-n junctions can be found at an interface of the termination rings and the surrounding n-type epitaxial layer. In some embodiments, the termination rings can be spaced laterally apart from each other by equal distances; but in some other embodiments, the termination rings can be spaced laterally apart from each by distances that are smaller near a center region near the semiconductor device and which become larger near an outer periphery of the termination region. The termination rings can be formed by different methods as will be disclosed in detail below.

Figure 1:
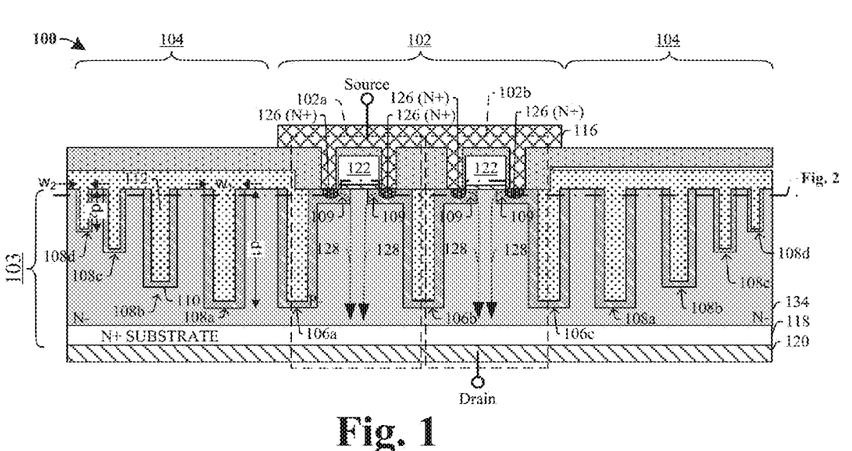
FIG. 1 illustrates a cross-sectional view of some embodiments of an integrated circuit with a cell region and a termination region.
Figure 2:
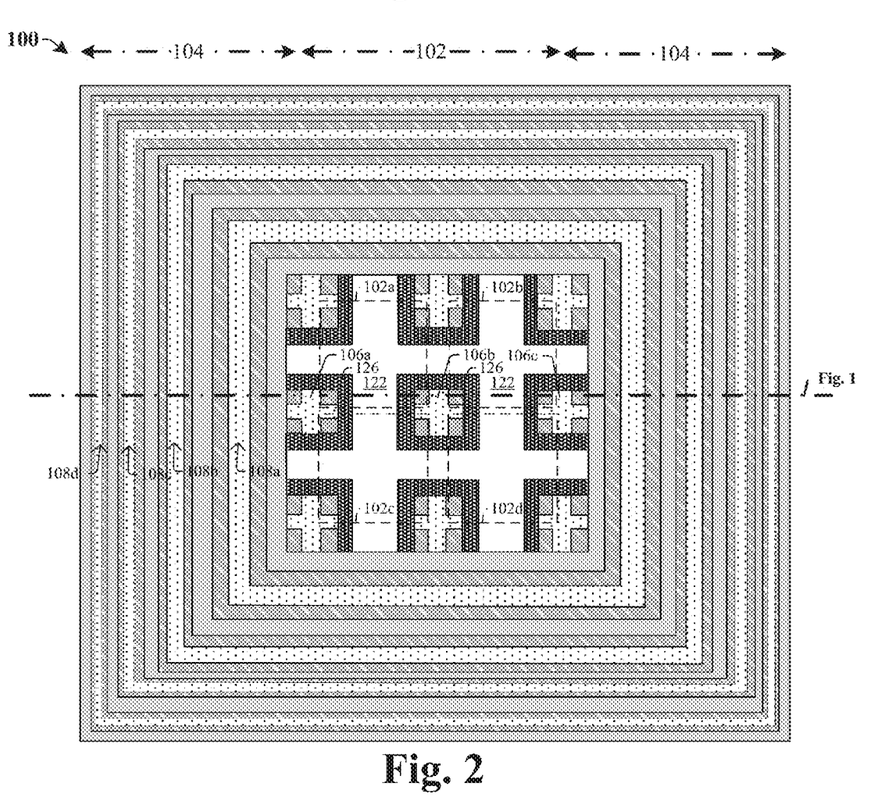
FIG. 2 illustrates a top view of some embodiments of an integrated circuit with a cell region and a termination region corresponding to FIG. 1.

With reference to FIG. 1 and FIG. 2, an integrated circuit 100 including a power MOSFET in accordance with some embodiments is illustrated. In particular, FIG. 1 shows a cross-sectional view of integrated circuit 100 along line A-A' of FIG. 2, and FIG. 2 shows a corresponding top view in accordance with some embodiments. As shown, the power MOSFET includes a device region 102 and a termination region 104. The device region 102 may comprise an array of device cells, for example, device cells 102a, 102b, 102c, and 102d. Each device cell comprises a highly doped n-type source region 126 arranged near an upper surface of a device substrate 103, and a highly doped n-type drain region 118 arranged near a lower surface of the device substrate 103. The n-type source regions 126 are connected to a source contact 116, and a highly doped n-type drain region 118 is optionally connected to a drain contact 120 on the lower surface of the device substrate 103. Under or adjacent to the highly doped n-type source regions 126, an array of p-type columns or p-type rings 106a, 106b, 106c is disposed within an n-type drift layer 134. A gate electrode 122 is arranged over a p-type channel region 109 positioned within a p-type body arranged within the columns or rings 106.

During operation, if a sufficiently large voltage-source bias is applied to the gate electrode 122 and source 126 (relative to drain 120), charge will flow vertically between source and drain as indicated by arrows 128. In particular, electrons can move from source region 126 through channel 109, and then drift downward through drift region 134 before reaching drain 118/120. Notably, the words "source" and "drain" don't limit the current flow direction and the source and drain regions 126 and 118 are switchable in that the direction of current flow may depend on bias and device structure settings. Because multiple device cells 102 can each contribute to the overall current of the device, this power FET can provide significant current levels. If a reverse bias is applied to the gate structure 122, the device enters an off-state where a depletion region can be spread at p-n junctions between the p-type column 106a and the n-type drift layer 134. The existence of these p-n junctions with relatively high impurity concentrations helps to maintain the depletion under a relatively high bias. Thus, the device provides a higher breakdown voltage while still achieving a small on-state resistance.

Notably, the significant amount of vertical current through the device 100 can lead to significant electric field or electric potentials, which can damage the device absent sufficient safeguards. Thus, to mitigate the risk of damage due to large electric fields or electric potentials, the termination region 104 is disposed at an outer periphery of the cell region 102. The termination region 104 comprises a plurality of termination rings 108, for example, 108a-d, circumscribing the cell region 102. In some embodiments, the termination region 104 can comprise continuous termination rings 108a-d as shown in FIG. 2. In some other embodiments, each termination ring 108 can comprise discrete structures circumscribing the cell region 102. Thus, although FIG. 2 shows each termination ring being a continuous ring, in other embodiments a termination ring can be made up of multiple discontinuous segments but can still be ring-like in that its segments still generally circumscribe the device region 102.

The termination rings 108 are configured to collectively and gradually attenuate electrical field and/or electrical potential and thereby prevent breakdown of the device 100. To help implement this gradual attenuation of electrical field or electrical potential, the termination rings 108a-d may have different depths and/or widths. In some embodiments, the depths and/or widths are larger near a central region closer to the cell region 102 and grow gradually and/or continuously smaller near a peripheral region closer to the termination rings 108. For example, innermost termination ring 108a has a first terminal ring depth, d1, and a first terminal ring width, w1; while outermost termination ring 108d has a second terminal ring depth, d2, and a second terminal ring width, w2; wherein d1 is greater than d2 and w1 is greater than w2. In some embodiments, the difference between d2 to d1 can reach to up to about 70 μm. In some embodiments, the innermost p-type ring 108a of the termination region 104 may have a depth that is substantially same to the depth of the neighboring p-type column or ring 106a.

In some embodiments, the termination rings 108 each comprises a p-type region 110 disposed within n-type semiconductor layer 134. A filling material 112, for example, an insulating material such as a dielectric or an oxide can be disposed within a recess inside the p-type region 110. The p-type region 110 has a cross-section that is substantially u-shaped or v-shaped, as shown in FIG. 1. In some embodiments, the cross-section of the p-type region 110 has a height to width ratio that is greater than approximately 10:1 and less than approximately 50:1. Depths of each p-type region 110 can be in a range of between approximately 3 μm and approximately 70 μm. In some embodiments, a ratio of the depths of the neighboring p-type regions can be 0.5, 0.6, 0.7, 0.8, or 0.9, which is in a range of between approximately 0.5 and approximately 0.9. Or the difference of the depths of two neighboring p-type regions can be 20 μm, 15 μm, 10 μm, 8 μm, 5 μm, or 1 μm, which is in a range of between approximately 1 μm and approximately 20 μm. Widths of each p-type ring 110 can be in a range of between approximately 0.3 μm and approximately 5 μm.

Although the illustrated device region 102 has been illustrated and described with regards to a superjunction power MOSFET device, it will be appreciated that the disclosed termination region 104 with its plurality of termination rings 108, though advantageous in such a context, is not limited to such devices. For example, in other embodiments, the disclosed termination region 104 and termination rings 108 can find utility in other vertical current devices, which can make use of ring type architectures as well as inter-digitated finger architectures. Further, the disclosed termination region and termination rings 108 may also find utility in lateral devices, particularly when large currents, voltages, and/or powers lend themselves to large electric fields or large electrostatic potentials. Notably, the arrangement of the termination rings helps to gradually attenuate these electric fields or electrostatic potentials to mitigate risk of device breakdown.

Figure 3:
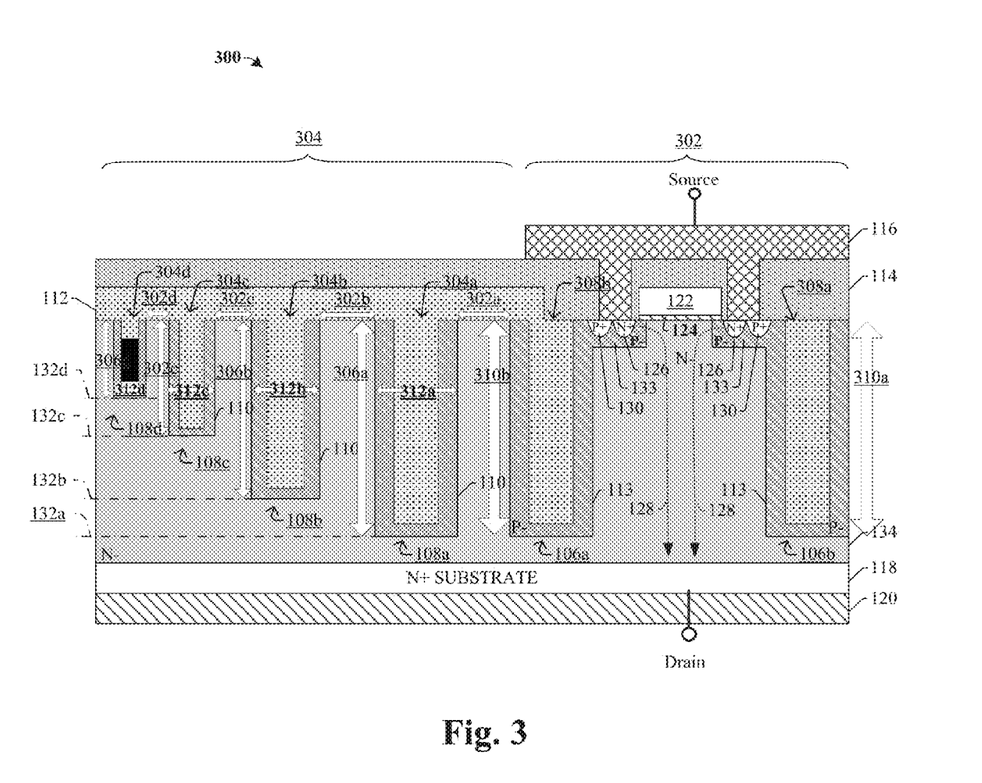
FIG. 3 illustrates a cross-sectional view of some embodiments of an integrated circuit with a cell region and a termination region.

FIG. 3 illustrates a cross-sectional view of some embodiments of an integrated circuit 300. In some embodiments, the integrated circuit 300 comprises a highly doped semiconductor substrate 118 which has a first doping type (e.g., n-type). An epitaxial (EPI) layer 134 is disposed over the highly doped semiconductor substrate 118 which also has the first doping type but with a lower doping concentration. The EPI layer 134 comprises a cell region 302 and a termination region 304.

Referring to the cell region 302, a gate electrode 122 is disposed over the EPI layer 134 directly above the cell region 302 and electrically isolated from the EPI layer 134 by a gate dielectric 124. Highly doped region 126 which has the first doping type is disposed within the EPI layer 134 on opposite sides of the gate electrode 122 near an upper surface of the EPI layer 134. The highly doped semiconductor substrate 118 and the highly doped regions 126 are configured as source/drain regions of an active device of the cell region 302. In some embodiments, the cell region 302 comprises at least two neighboring deep trenches 106a, 106b, which have a second conductivity type (e.g., p-type) and which meet the EPI layer 134 at p-n junctions 113. The p-n junctions 113 are substantially u-shaped or v-shaped in some embodiments. In some embodiments, body contact regions 130, which are highly doped with a second conductivity type (e.g., p-type), are disposed on opposite sides of the gate electrode 122 near the upper surface of the EPI layer 134. In some embodiments, the body contact regions 130 are disposed adjacent to the source/drain regions 126 at outer sides of the body contact regions 130 further from the gate electrode 122. In some embodiments, the source/drain regions 126, which have the first conductivity type, are disposed within body regions 133, which are lightly doped with the second conductivity type (e.g., p-type), and disposed on opposite sides of the gate electrode 122 near the upper surface of the EPI layer 134. As an example, the source/drain regions 126 can have a doping concentration around $10^{19}$ ions/cm$^3$ and the body contact regions 130 can have a doping concentration ranging from about $10^{17}$ ions/cm$^3$ to about $10^{19}$ ions/cm$^3$. The body regions 133 can have a doping concentration ranging from about $10^{15}$ ions/cm$^3$ to about $10^{18}$ ions/cm$^3$ and the deep trenches 106 can have a doping concentration ranging from about $10^{14}$ ions/cm$^3$ to about $10^{17}$ ions/cm$^3$.

Referring to the termination region 304, a plurality of deep columns 108a, 108b, 108c and 108d are disposed within the termination region 304 from the surface of the EPI layer 134. The deep columns 108a-d, respectively, have depths 306a, 306b, 306c and 306d, respectively and widths 312a, 312b, 312c and 312d, respectively. Distances between neighboring columns 108a-d respectively is 302a, 302b, 302c and 302d, respectively. A filling material 112 is disposed into recesses 304a, 304b, 304c and 304d inside the deep columns 108a-d. The deep columns 108a-d comprise peripheral portions 110 having the second conductivity type. The deep columns 108 can have either vertical sidewalls that are perpendicular to upper substrate surface or non-vertical sidewalls that are acute or obtuse with regards to upper substrate surface. The deep columns 108 can be formed by vertical or tilt implantation processes. The depths 306a, 306b, 306c and 306d and/or the widths 312a, 312b, 312c and 312d can be gradually decreased from center device region 302 towards outer edge of peripheral region 104. As an example, the depths 306a-d can be in a range of between approximately 3 μm and approximately 70 μm; the widths 312a, 312b, 312c and 312d can be in a range of between approximately 0.3 μm and approximately 5 μm. A ratio of the corresponding depth to width 306:312 can be greater than approximately 10:1 and less than approximately 50:1. A ratio of the depths of the neighboring deep columns, such as 306d:306c, 306c:306b or 306b:306a can be in a range of between approximately 0.5 and approximately 0.9. Or the difference of the depths of two neighboring deep columns can be in a range of between approximately 5 μm and approximately 20 μm. Depth differences between 306a and 306b, 306b and 306c, or 306c and 306d can be same or different. As an example, the depth 306a of deep column 108a is 70 μm, the depth 306b of deep column 108b can be 20 μm less, which is 50 μm; the depth 306c of deep column 108c can be also 20 μm less, which is 30 μm; and the depth 306d of deep column 108d can be also 20 μm less, which is 10 μm. As another example, still the depth 306a of deep column 108a is 70 μm, the depth 306b of deep column 108b can be about 0.7 times less, which is 50 μm; the depth 306c of deep column 108c can be also 0.7 times less, which is 35 μm; and the depth 306d of deep column 108d can be also 0.7 times less, which is 17 μm. In some embodiments, the distances 302a, 302b, 302c and 302d can be same, while in some other embodiments, the distances 302a, 302b, 302c and 302d can be decreased from center device region 302 towards outer edge of peripheral region 104. As an example, the distances 302a-d can be in a range of between approximately 5 μm and approximately 15 μm. The deep columns 108 can have a doping concentration ranging from about $10^{14}$ ions/cm$^3$ to about $10^{17}$ ions/cm$^3$.

During operation, current selectively flows from the source regions 126 to the drain 118 (or vice versa) based largely on a gate-source voltage (VGS) and source-drain voltage (VSD). For example, consider an example where a HV super junction device of the cell region 102 is an n-type device with n-type source/drain regions 126/118 and p-type body regions 133 with a voltage threshold of 1.1 volts. In such a device, charge depletion occurs near p-n junctions between the sources 126 and body regions 133, and near p-n junctions between the body regions 133 and the EPI layer 134. Hence, if a gate voltage of 1.1 volts or greater is applied to the gate electrode 122, inversion occurs in the channel region of the body region 133 so electrical carriers (e.g., holes and electrons) are freed from the lattice and become mobile. When a source/drain voltage is applied, these now mobile electrical carriers are swept from source 126 to drain 118 (or vice versa) such that a current flows vertically between source 126 and drain 118 as shown by arrows 128. If the gate voltage is less than the threshold voltage, there is no inversion in the channel and current between source 126 and drain 118 is blocked. For a p-type device (not illustrated), the doping conventions and voltage biased are reversed, but selective current flow is still based on the biases applied to the device.

Thus, the integrated circuit 300 comprises a vertical region between the source region 126 and drain region 118 that acts as a resistive region. In particular, this resistive region lies along the vertical p-n junction 113, and helps dissipate large voltages over its length thereby promoting a large breakdown voltage. The integrated circuit 300 will consequently have a low on resistance (Ron), low power consumption, and high break down voltage. As a previous weak point, peripheral edges of the cell region 302 are circumscribed by a termination 304. The deep columns 108a-d with p-n junctions disposed at the interface regions extend a depletion region to release electrical potential and provide stronger termination than previous approaches.

Figure 4:
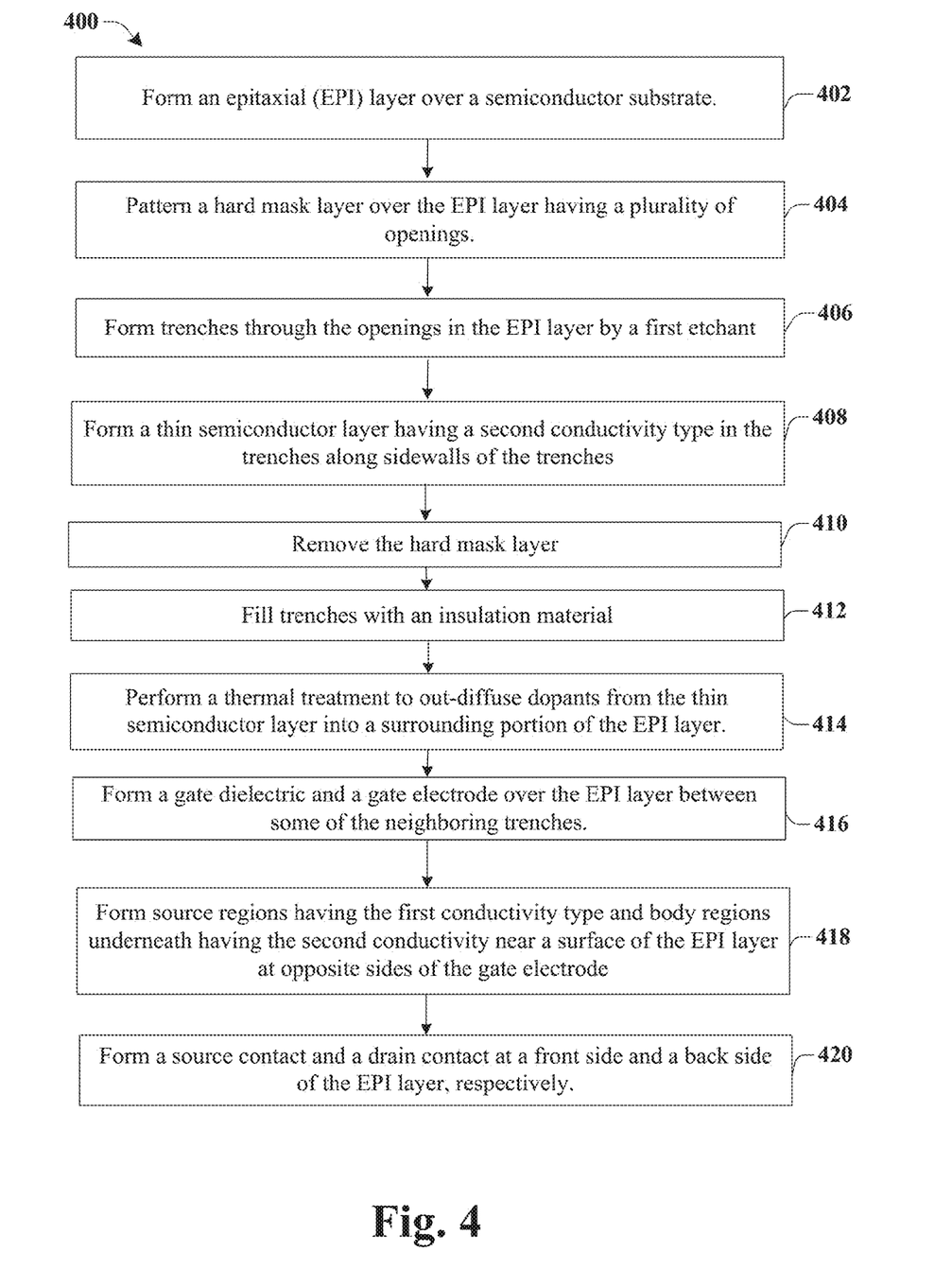
FIG. 4 illustrates a flow diagram of some embodiments of a method of forming an integrated circuit with a cell region and a termination region.

FIG. 4 illustrates a flow diagram of a method 400 of forming an integrated circuit with a cell region and a termination region according to some embodiments.

While the disclosed methods (e.g., method 400) are illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 402, an epitaxial (EPI) layer is formed over a semiconductor substrate. The semiconductor substrate is relatively heavily doped by a first conductivity type and the EPI layer is relatively lightly doped by the first conductivity type.

At act 404, a hard mask layer is patterned over the EPI layer having a plurality of openings. Some of the openings may have a same width. Some other openings at outer periphery have widths that are smaller than openings nearer the device region.

At act 406, trenches are formed through the openings in the EPI layer by a first etchant.

At act 408, a thin semiconductor layer having a second conductivity type is formed in the trenches along or within sidewalls of the trenches.

At act 410, the hard mask layer is removed.

At act 412, an insulation material is filled into the trenches.

At act 414, a thermal treatment is performed to out-diffuse dopants from the thin semiconductor layer into a surrounding portion of the EPI layer, thereby forming an out-diffused region having the second conductivity type.

At act 416, a gate dielectric and a gate electrode are formed over the EPI layer between some of the neighboring trenches.

At act 418, source regions are formed having the first conductivity type and body regions are formed underneath having the second conductivity near a surface of the EPI layer at opposite sides of the gate electrode.

At act 420, a source contact and a drain contact are formed at a front side and a back side of the EPI layer, respectively.

FIGS. 5A-L illustrate some cross-sectional views showing a method of forming an integrated circuit with a cell region and a termination region according to some embodiments. Although FIGS. 5A-L are described in relation to the method 400, it will be appreciated that the structures disclosed in FIGS. 5A-L are not limited to the method 400, but instead may stand alone as structures independent of the method 400. Similarly, although the method 400 is described in relation to FIGS. 5A-L, it will be appreciated that the method 400 is not limited to the structures disclosed in FIGS. 5A-L, but instead may stand alone independent of the structures disclosed in FIGS. 5A-L.

Figure 5A:
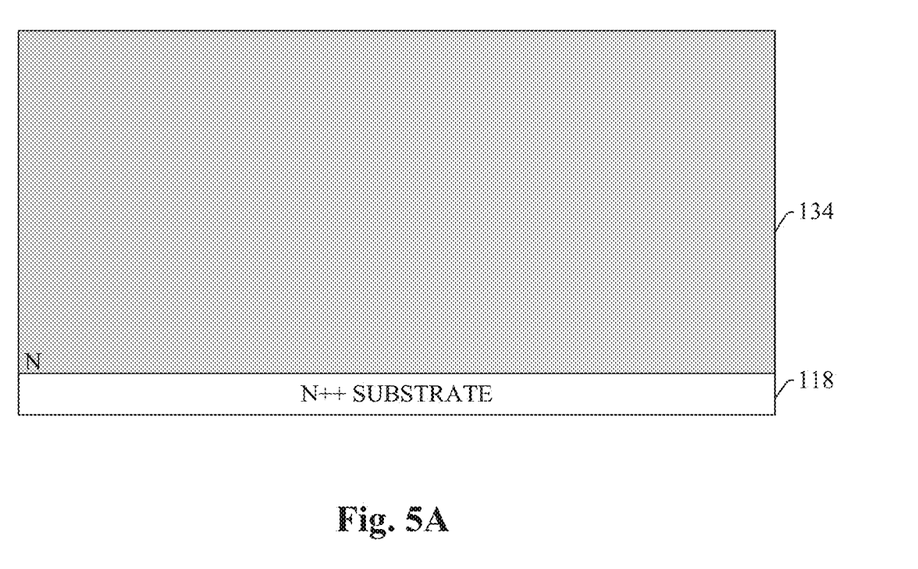
FIGS. 5A-L illustrate some embodiments of cross-sectional views of a method of forming an integrated circuit with a cell region and a termination region.

FIG. 5A illustrates some embodiments of a cross-sectional view corresponding to act 402. As shown in FIG. 5A, an epitaxial (EPI) layer 134 is formed over a semiconductor substrate 118. The semiconductor substrate 118 is relatively heavily doped by an n-type dopant. The EPI layer 134 is relatively lightly doped by an n-type dopant. The n-type EPI layer 134 and the semiconductor substrate 118 can be a bulk region of an n-type semiconductor wafer, or an n-well region in a p-type semiconductor wafer. Further, it will be appreciated that "semiconductor substrate" or "wafer" as referred to herein may comprise any type of semiconductor material including a bulk silicon wafer, a binary compound substrate (e.g., GaAs wafer), a ternary compound substrate (e.g., AlGaAs), or higher order compound wafers, with or without additional insulating or conducting layers formed thereover, among others. Further, the semiconductor substrate can also include non-semiconductor materials such as oxide in silicon-on-insulator (SOI), partial SOI substrate, polysilicon, insulator, oxide, metal, amorphous silicon, or organic material, among others. In some embodiments, the semiconductor substrate can also include multiple wafers or dies which are stacked or otherwise adhered together. The semiconductor substrate can include wafers which are cut from a silicon ingot, and/or any other type of semiconductor/non-semiconductor and/or deposited or grown (e.g. epitaxial) layers formed on an underlying substrate. An example thickness of the EPI layer 134 is from about 10 μm to about 70 μm.

Figure 5B:
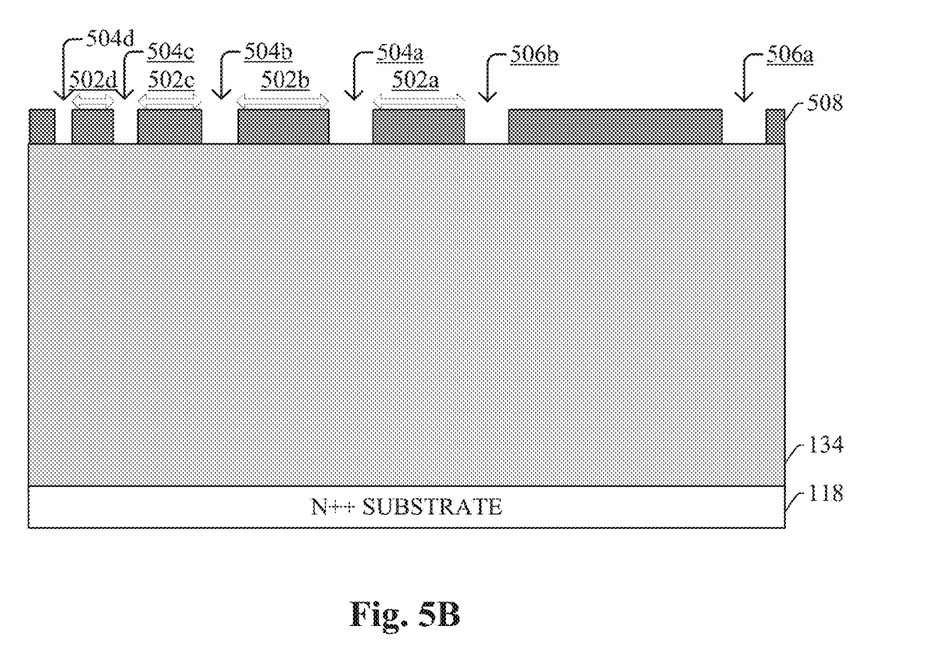

FIG. 5B illustrates some embodiments of a cross-sectional view corresponding to act 404. As shown in FIG. 5B, a hard mask layer, such as a nitride or oxide mask, is formed over the underlying EPI layer 134. A photoresist layer is formed and patterned (not shown) over the hard mask layer. With the patterned photoresist layer in place over the hard mask layer, an etch is carried out to form a patterned hard mask layer 508. The patterned hard mask layer 508 comprises a first portion of openings 506, such as 506a and 506b, having a same width; and a second portion of openings 504, such as 504a, 504b, 504c, and 504d, having different widths. In some embodiments, the second portion of openings 504, have smaller widths closer to the first portion 506 (e.g. 504a) and larger widths closer to an outer edge of peripheral region. Corresponding distances 502 between neighboring openings 504 can be larger near portion 506 and can decrease further from portion 506. An example distance 502 could be between about 5 μm to about 15 μm. In some embodiments, the depths or widths of the termination rings decrease linearly, parabolically, or exponentially from the center to the outer periphery of the termination region. The depths or widths can decrease uni-directionally from the center to the outer periphery of the termination region, even if not by the same amount between successive rings.

Figure 5C:
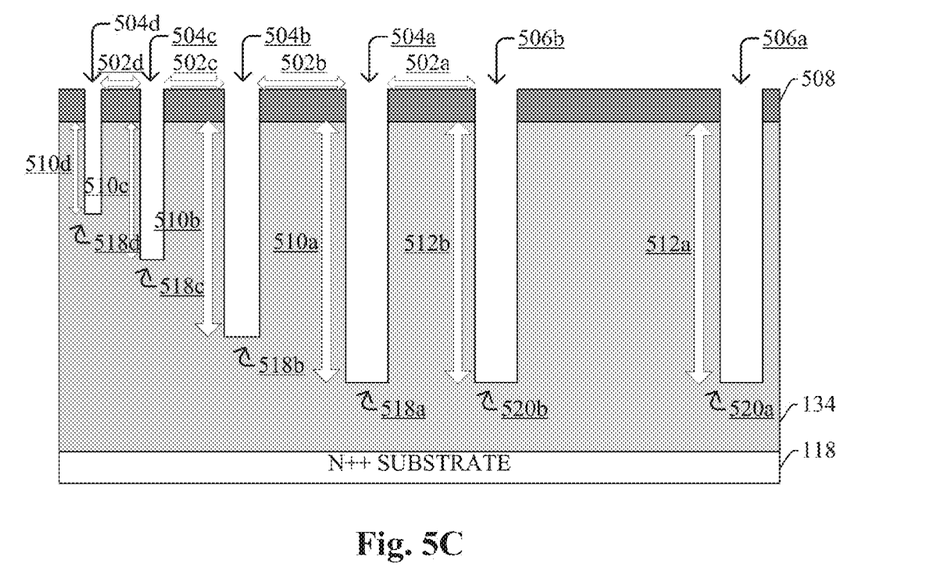

FIG. 5C illustrates some embodiments of a cross-sectional view corresponding to act 406. As shown in FIG. 5C, a dry etch is carried out with the patterned hard mask layer 508 in place to form first and second portions of trenches 520 and 518 corresponding to the first and second portions of openings 506 and 504 in the n-type EPI layer 134. The trenches 520 and 518 have sidewalls and a bottom surface. Depths of the trenches 520 and 518 are related to width of the openings 506 and 504. The wider an opening is, the deeper a corresponding trench is in some embodiments. As an example, the trenches have a trench depth ranging from approximately 3 μm to approximately 70 μm, and a trench width ranging from approximately 0.3 μm to approximately 5 μm.

Figure 5D:
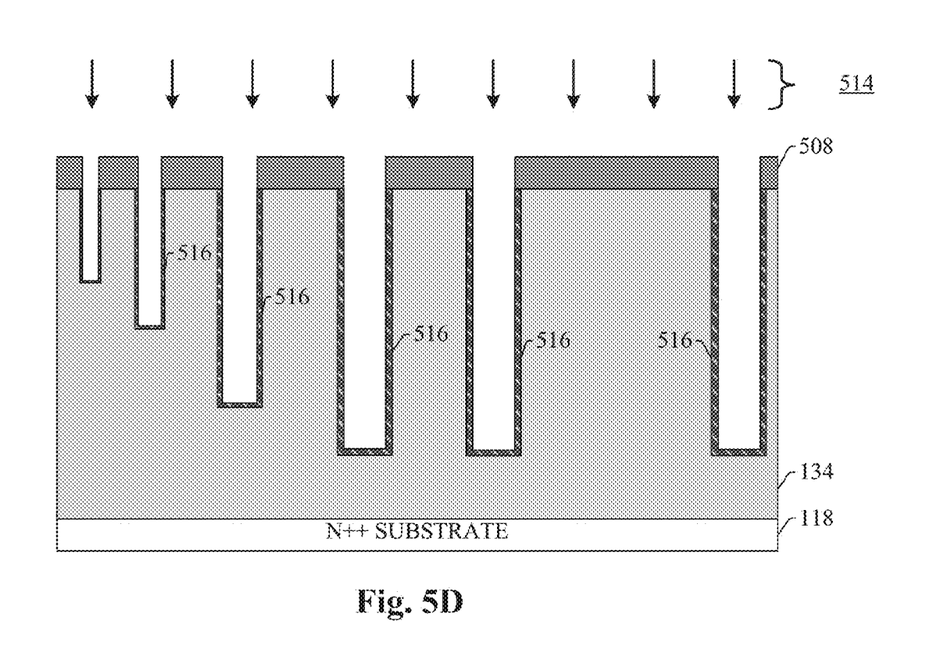

FIG. 5D illustrates some embodiments of a cross-sectional view corresponding to act 408. As shown in FIG. 5D, a thin semiconductor layer 516 having a second conductivity type is formed in the trenches along or within the sidewalls and bottom surface of the trenches. In some embodiments, the thin semiconductor layer 516 is deposited by driving dopant gas 514 having into exposed sidewalls and bottom surface of the trenches. For example, $B_2H_6$ and/or $BCl_3$ gas can be applied for a time of between approximately 100 s and approximately 300 s at a temperature in a range of between approximately 1000° C. and approximately 1200° C.

Figure 5E:
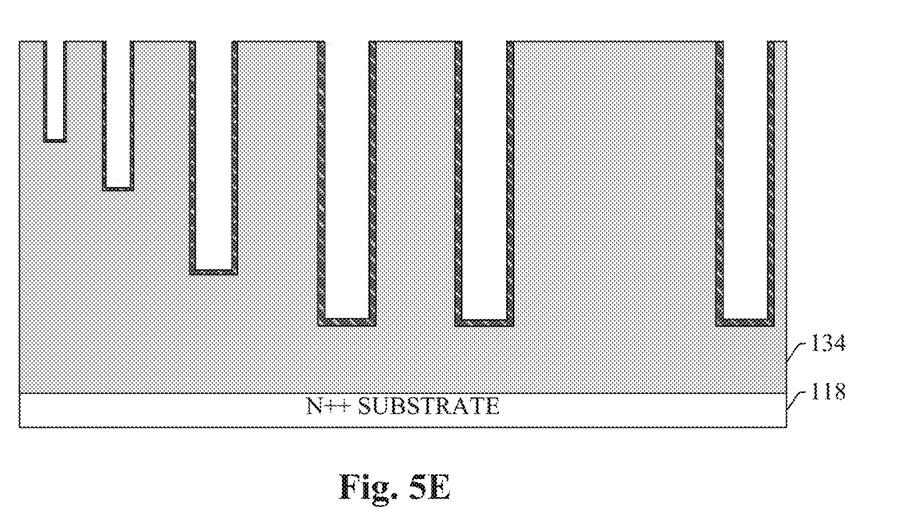

FIG. 5E illustrates some embodiments of a cross-sectional view corresponding to act 410. In some embodiments, the hard mask layer 508 is removed by a wet etch.

Figure 5F:
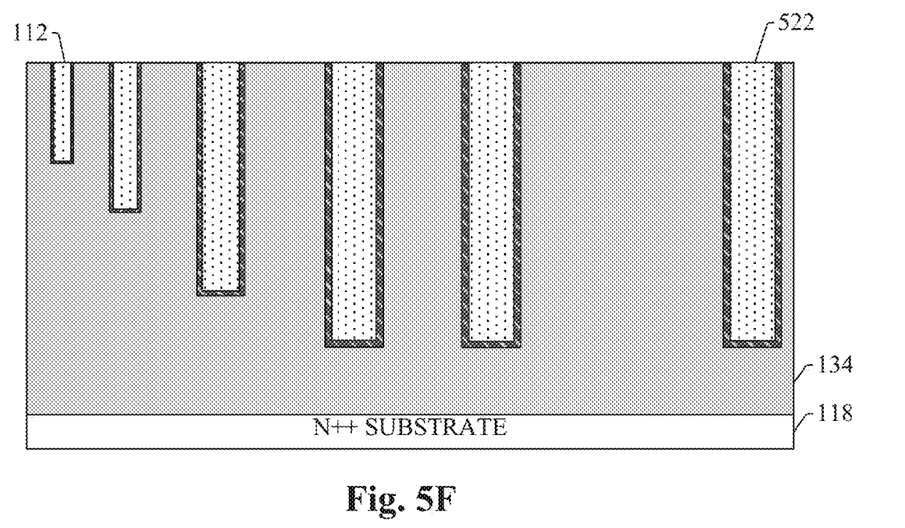

FIG. 5F illustrates some embodiments of a cross-sectional view corresponding to act 412. As shown in FIG. 5F, an insulation material 522 is filled into trenches. In some embodiments, the insulation material can be formed by Physical Vapor Deposition (PVD), Chemical Vapor Deposition (CVD) or Epitaxy. As an example, the insulation material could be silicon oxide or silicon nitride. The filled insulation material 522 can be formed by deposition followed by an etch back process.

Figure 5G:
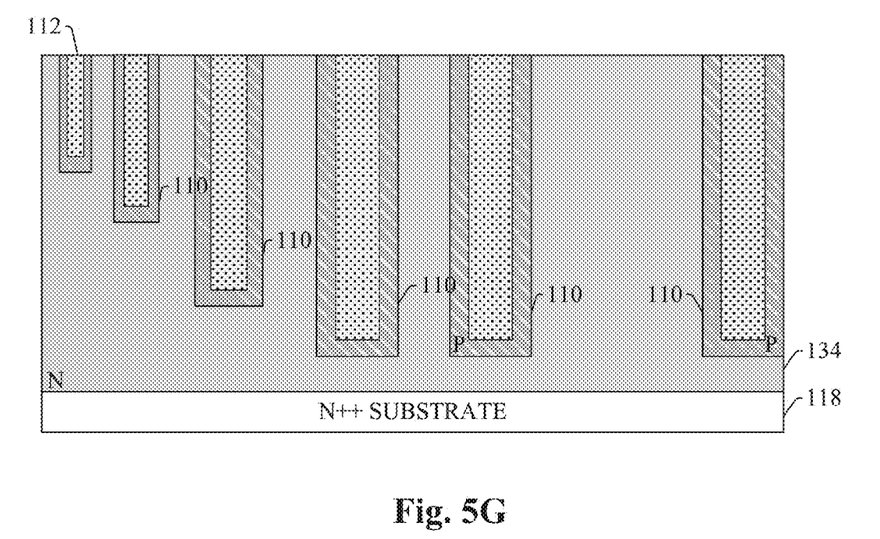

FIG. 5G illustrates some embodiments of a cross-sectional view corresponding to act 414. As shown in FIG. 5G, a thermal process is used to drive in the dopants from the thin layer 516 into the surrounding EPI layer 134, thereby forming an out-diffused p+ region 110. For example, in one embodiment, the wafer can be subjected to a heat treatment of approximately 1100° C.-1250° C. for approximately 30 mins-300 mins to out-diffuse the dopants approximately 1 μm to 5 μm into the surrounding n-type EPI layer.

Figure 5H:
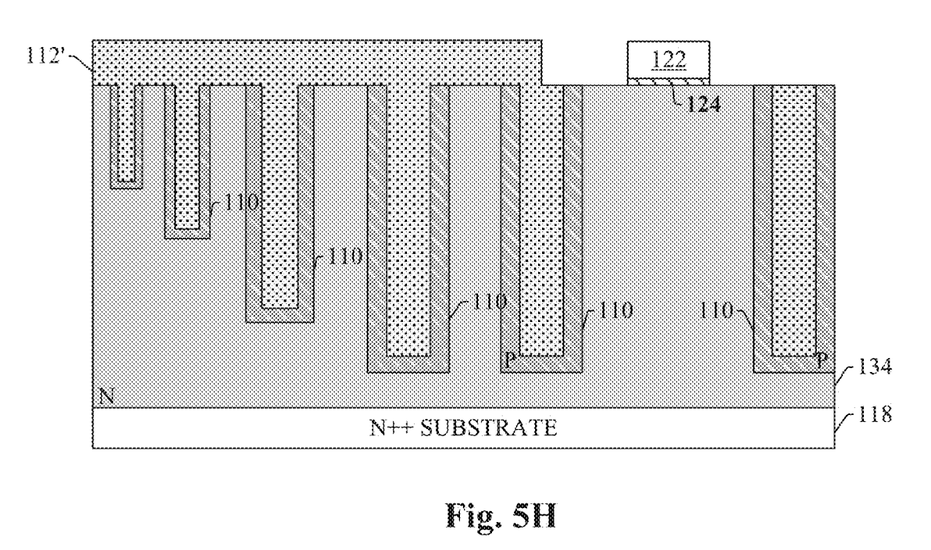

FIG. 5H illustrates some embodiments of a cross-sectional view corresponding to act 416. As shown in FIG. 5G, a gate dielectric 124 and a gate electrode 122 are formed over the EPI layer 134 between neighboring two trenches of the first portion 520.

Figure 5I:
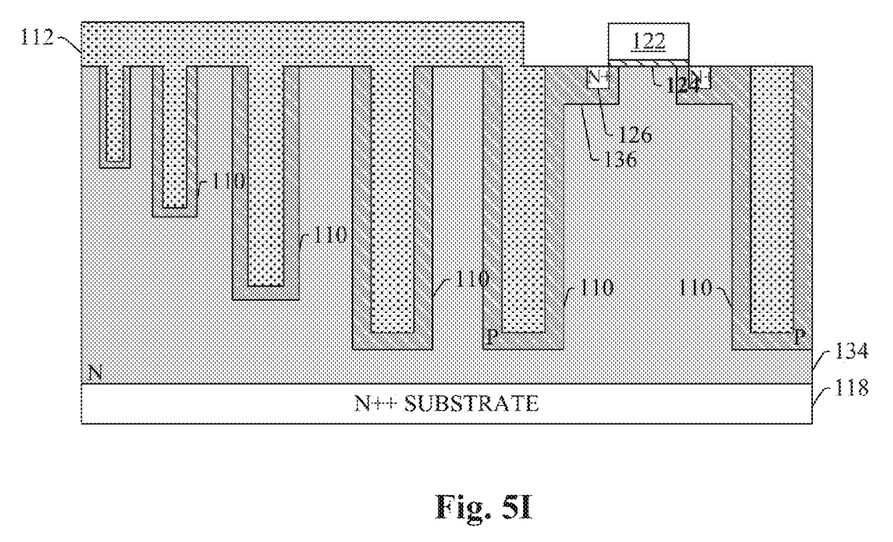

FIG. 5I illustrates some embodiments of a cross-sectional view corresponding to act 418. As shown in FIG. 5I, source regions 126 are formed having the first conductivity type and body regions 136 are formed underneath having the second conductivity near a surface of the EPI layer 134 at opposite sides of the gate electrode 122.

Figure 5J:
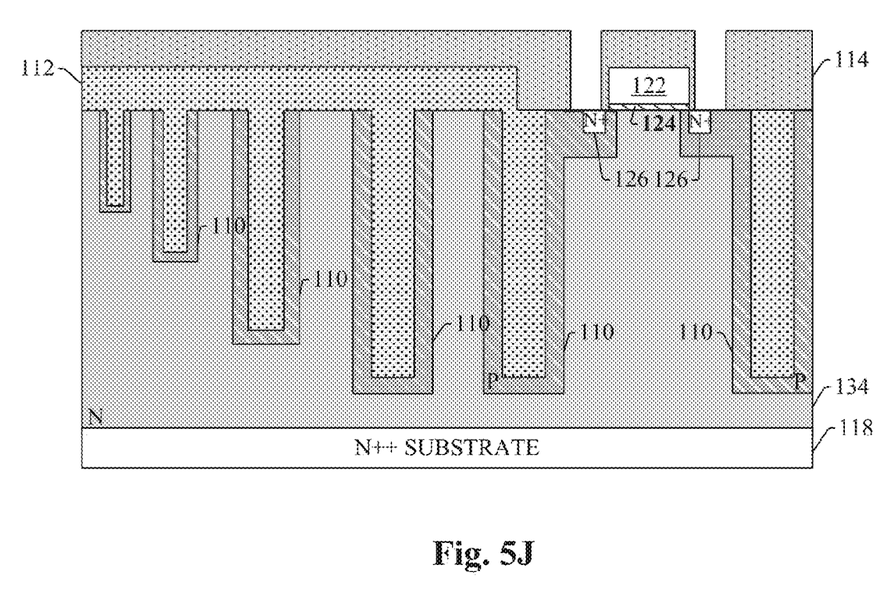
Figure 5K:
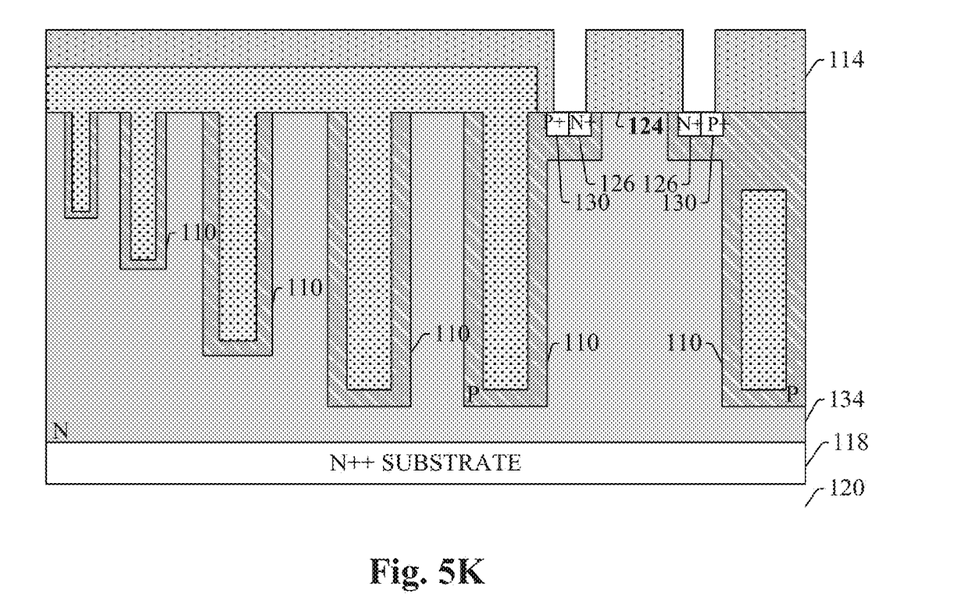
Figure 5L:
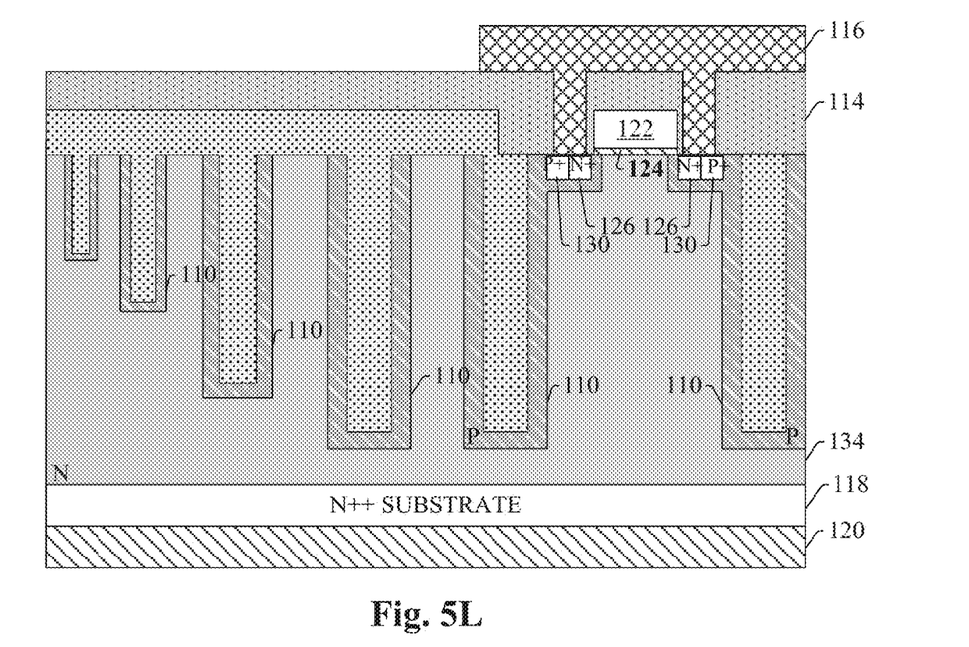

FIGS. 5J-L illustrate some embodiments of cross-sectional views corresponding to act 420. As shown in FIGS.

5J-L, a dielectric layer 114, body contacts 130 and source and drain contacts 116 and 120 are formed respectively.

Therefore, the present disclosure relates to an integrated circuit with a termination region, and an associated method of formation. In some embodiments, the termination region comprises a plurality of deep p-type columns disposed within an n-type epitaxial layer. Deep p-n junctions can be formed thereby to gradually release electrical at an edge region.

In some embodiments, the present disclosure relates to an integrated circuit. The integrated circuit comprises a cell region and a termination region. The termination region is disposed at an outer periphery of the cell region. The cell region comprises an array of device cells. The termination region comprises a plurality of termination rings encompassing the cell region. The plurality of termination rings have different depths.

In other embodiments, the present disclosure relates to a metal oxide semiconductor field effect transistor (MOSFET). The MOSFET comprises a highly doped n-type semiconductor substrate configured as a drain/source of the MOSFET. The MOSFET further comprises a n-type epitaxial (EPI) layer disposed over the semiconductor substrate having a cell region and a termination region disposed in lateral. The termination region is disposed at an outer periphery of the cell region. The MOSFET further comprises a gate electrode disposed over the EPI layer directly above the cell region and electrically isolated from the EPI layer by a gate dielectric. The MOSFET further comprises a highly dope n-type region configured as a source/drain of the MOSFET disposed within the EPI layer on opposite sides of the gate electrode near an upper surface of the EPI layer. The MOSFET further comprises a plurality of p-type column regions disposed within the termination region from the surface of the EPI layer.

In yet other embodiments, the present disclosure relates to a method of forming integrated circuits. The method comprises forming an epitaxial (EPI) layer over a semiconductor substrate, the EPI layer and the semiconductor substrate having a first conductivity type. The method further comprises forming a plurality of deep trenches in the EPI layer having different depths. The method further comprises forming a plurality of column regions having a second conductivity type adjacent or within sidewalls of the deep trenches. The method further comprises forming an insulation layer over the EPI layer. The method further comprises forming a power MOSFET structure apart laterally from the plurality of column regions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit, comprising:
a cell region comprising an array of device cells arranged on a device substrate, the cell region comprising a plurality of doped columns separated from one another by a gate electrode matrix and extended from an upper surface of the device substrate downwardly to a first depth within the device substrate; and
a termination region disposed at an outer periphery of the cell region, the termination region comprising a plurality of termination rings concentrically surrounding the cell region;
wherein the plurality of termination rings include a conformal layer of doped material which extends downwardly to different depths beneath the upper surface of the device substrate, and wherein a first distance separating a pair of neighboring termination rings near a center of the termination region nearest the cell region is greater than a second distance separating a second pair of neighboring termination rings near an outer periphery of the termination region;
wherein the first depth of the plurality of doped columns is substantially equal to a depth of an innermost termination ring of the plurality of termination rings nearest the cell region;
wherein a first dielectric layer extends over the upper surface of the device substrate and extends downwardly along inner sidewalls and lower surfaces of the plurality of doped columns and the conformal layer of doped material to fill a recess in upper surfaces of the doped columns and the conformal layer;
wherein a second dielectric layer is disposed on the first dielectric layer, wherein the second dielectric layer has a bottom surface in direct contact with an upper surface of the plurality of doped columns in the cell region.

2. The integrated circuit of claim 1, wherein the plurality of termination rings are disposed within an n-type epitaxial layer, and wherein each of the plurality of termination rings comprises a p-type ring with the first dielectric layer disposed within a recess inside the p-type ring.

3. The integrated circuit of claim 1, wherein an inner termination ring near a center of the termination region has a first depth or first width that is greater than a second depth or second width of an outer termination ring near an outer periphery of the termination region.

4. The integrated circuit of claim 3, wherein depths or widths of the termination rings decrease linearly, parabolically or exponentially from the center to the outer periphery of the termination region.

5. The integrated circuit of claim 1, wherein the plurality of termination rings are disposed within an n-type epitaxial layer, and meet the surrounding n-type epitaxial layer at a p-n junction deep in the n-type epitaxial layer.

6. The integrated circuit of claim 1, wherein the plurality of termination rings have depth to width aspect ratios greater than approximately 10:1 and less than approximately 50:1.

7. The integrated circuit of claim 1, wherein depths of the plurality of termination rings are in a range of between approximately 3 µm and approximately 70 µm, and wherein widths of the plurality of termination rings are in a range of between approximately 0.3 µm and approximately 5 µm.

8. The integrated circuit of claim 1, wherein the cell region comprises an array of super junction MOSFETs by which current passes vertically from a source region located at a front side of the device substrate to a drain region located at a back side of the device substrate.

9. The integrated circuit of claim 8, wherein the super junction MOSFET comprises:
a highly doped semiconductor substrate with a first conductivity type;
a first epitaxial semiconductor layer disposed over a front side of the highly doped semiconductor substrate;

a first highly doped region with the first conductivity type disposed near a top surface of the first epitaxial semiconductor layer, configured as a source/drain region of the super junction MOSFET; and a first electrode coupled to the first highly doped regions and a second electrode coupled to a back side of the highly doped semiconductor substrate configured as source or drain electrodes of the super junction MOSFET.

10. The integrated circuit of claim 1, further comprising:
an epitaxial layer disposed on the semiconductor substrate, wherein the plurality of termination rings extend downwardly into a plurality of trenches in the epitaxial layer to establish the different depths without extending into the semiconductor substrate.

11. A metal oxide semiconductor field effect transistor (MOSFET), comprising:
a semiconductor substrate;
a n-type epitaxial (EPI) layer disposed over the semiconductor substrate and having a cell region and a termination region, the termination region circumscribing an outer periphery of the cell region;
a gate electrode disposed over a planar region of the EPI layer directly above the cell region and electrically isolated from the planar region of the EPI layer by a gate dielectric;
a highly doped n-type region configured as a source/drain of the MOSFET disposed within the EPI layer on opposite sides of the gate electrode near an upper surface of the EPI layer;
a p-type column disposed within the cell region at sides of the highly doped n-type region away from the gate electrode and extended under the highly doped n-type region, wherein the p-type column is disposed along sidewall and lower surfaces of a deep trench extending downwardly from the upper surface of the EPI layer;
a plurality of p-type termination rings disposed on sidewall and lower surfaces of a plurality of trenches within the termination region and extending downwardly from the upper surface of the EPI layer; and
a dielectric layer disposed on the p-type column and the p-type termination rings to fill remaining spaces of the trenches within the cell region and the termination region, the dielectric layer extending out from the trenches and extending continuously on the upper surface of the EPI layer between neighboring p-type termination rings in the termination region, while filling the trenches to have an upper surface coplanar with upper surfaces of the EPI layer and the p-type column within/in the cell region.

12. The MOSFET of claim 11, wherein the plurality of p-type termination rings have depths and widths which decrease from the outer periphery of the cell region to an outer periphery of the termination region.

13. The MOSFET of claim 11, wherein the cell region further comprises a p-type termination ring disposed under or adjacent to the n-type region having a depth that is substantially equal to a depth of a most neighboring p-type column region of the termination region.

14. The MOSFET of claim 11, wherein depths of the plurality of p-type termination rings are in a range of between approximately 3 μm and approximately 70 μm, and wherein widths of the plurality of p-type termination rings are in a range of between approximately 0.3 μm and approximately 5 μm.

15. The MOSFET of claim 11, wherein a first distance separating a pair of neighboring termination rings near a center of the termination region nearest the cell region is greater than a second distance separating a second pair of neighboring termination rings near an outer periphery of the termination region.

16. A superjunction MOSFET device, comprising:
a cell region comprising:
a plurality of ring-shaped source/drain regions arranged in rows and columns near an upper surface of a semiconductor substrate, the ring-shaped source/drain regions having a first doping type;
a gate electrode extending over the upper surface of the semiconductor substrate and separating the neighboring ring-shaped source/drain regions from another;
a plurality of doped columns which correspond to inner portions of the ring-shaped source/drain regions and which are disposed at sides of the ring-shaped source/drain regions away from the gate electrode and extend downwardly from the upper surface of the semiconductor substrate to equal depths beneath lowermost portions of the ring-shaped source/drain regions, the doped columns having a second doping type; and
a plurality of concentric doped rings circumscribing an outer periphery of the cell region, the concentric doped rings having the second doping type and having depths or widths that monotonically decrease from an innermost doped ring nearest the cell region to an outermost doped ring furthest from the cell region, the plurality of concentric doped rings having depths equal or smaller than those of the plurality of doped columns;
a first dielectric layer extending downwardly along inner sidewalls and lower surfaces of the plurality of doped columns and the plurality of concentric doped rings, wherein the dielectric layer extends out from the concentric doped rings and is disposed along an upper surface of the semiconductor substrate in the outer periphery of the cell region, while has an upper surface coplanar with upper surface of the semiconductor substrate in the cell region; and
a second dielectric layer disposed on the first dielectric layer, wherein the second dielectric layer has a bottom surface in direct contact with an upper surface of the plurality of doped columns in the cell region;
wherein the innermost doped ring has a depth that is substantially equal to a depth of the plurality of doped columns in the cell region.

17. The superjunction MOSFET device of claim 16, wherein the depths or widths of the concentric doped rings decrease linearly, parabolically or exponentially from the innermost doped ring to the outermost doped ring.

18. The superjunction MOSFET device of claim 16, further comprising:
a plurality of concentric dielectric rings extending downwardly into the semiconductor substrate, wherein the plurality of doped concentric rings are disposed about sidewalls of the plurality of dielectric rings, respectively; and
a plurality of dielectric columns extending downwardly along a recessed upper surface of the plurality of doped column.

19. The MOSFET of claim 16, wherein a first pair of neighboring concentric doped rings nearest the outer periphery of the cell region are separated from one another by a first distance, and a second pair of neighboring termination rings further from the outer periphery of the cell region are separated from one another by a second distance which is greater than the first distance.

\* \* \* \* \*